(12) United States Patent
Pal et al.

(10) Patent No.: US 10,937,203 B1
(45) Date of Patent: Mar. 2, 2021

(54) DEVICES, SYSTEMS, AND METHODS FOR INTEGRATED CIRCUIT VERIFICATION

(71) Applicant: e-Infochips Limited, Ellisbridge (IN)

(72) Inventors: Babun Chandra Pal, West Bengal (IN); Rajesh Kumar Panda, Odisha (IN)

(73) Assignee: E-INFOCHIPS LIMITED, Gujarat (IN)

( * ) Notice: Subject to any disclaimer, the term of this patent is extended or adjusted under 35 U.S.C. 154(b) by 0 days.

(21) Appl. No.: 16/711,055

(22) Filed: Dec. 11, 2019

(51) Int. Cl.
*G06T 11/00* (2006.01)
*G06F 30/31* (2020.01)
*G06F 30/3308* (2020.01)

(52) U.S. Cl.
CPC ............ *G06T 11/001* (2013.01); *G06F 30/31* (2020.01); *G06F 30/3308* (2020.01)

(58) Field of Classification Search
CPC ..... G06T 11/001; G06F 30/31; G06F 30/3308
USPC .......................................................... 716/136
See application file for complete search history.

(56) References Cited

U.S. PATENT DOCUMENTS

| | | | | |
|---|---|---|---|---|
| 5,615,320 A * | 3/1997 | Lavendel | ............... | G06T 11/001 345/593 |
| 5,877,772 A * | 3/1999 | Nomura | ................ | G06T 11/203 345/582 |
| 6,829,754 B1 * | 12/2004 | Yu | ........................ | G06F 30/398 716/106 |
| 7,653,899 B1 * | 1/2010 | Lindahl | ............... | G06F 11/3636 717/128 |
| 8,471,854 B2 * | 6/2013 | Kelley | ................... | G06T 17/05 345/427 |
| 9,292,419 B1 * | 3/2016 | Kintali | ...................... | G06F 8/75 |
| 9,489,283 B1 * | 11/2016 | Popovici | ............. | G06F 11/3636 |
| 2005/0184999 A1 * | 8/2005 | Daioku | ............. | H04M 1/72552 345/589 |
| 2011/0238397 A1 * | 9/2011 | Chen | ....................... | G06F 30/33 703/13 |
| 2013/0111422 A1 * | 5/2013 | Reed | ........................ | G06F 30/39 716/102 |
| 2013/0318486 A1 * | 11/2013 | Sasaki | ..................... | G06F 30/30 716/106 |
| 2014/0005999 A1 * | 1/2014 | Agarwala | ............... | G06F 30/33 703/14 |

(Continued)

OTHER PUBLICATIONS

"How to change the output color of echo in Linux," Stack Overflow, May 10, 2011, retrieved from https://stackoverflow.com/questions/5947742/how-to-change-the-output-color-of-echo-in-linux, 36 pages.

(Continued)

*Primary Examiner* — Suresh Memula
(74) *Attorney, Agent, or Firm* — Sheridan Ross P.C.

(57) ABSTRACT

A method includes storing first macros that define colors of text generated during a simulation of a design under test (DUT) of an integrated circuit (IC). The method includes mapping second macros to the first macros based on a plurality of colors, where each of the plurality of colors is associated with one of a plurality of report messages generated by executing the second macros. The method includes conducting the simulation of the DUT, and displaying, based on the conducted simulation, the plurality of report messages in a format where each of the plurality of report messages is displayed in a color associated with the report message.

20 Claims, 5 Drawing Sheets

(56) References Cited

U.S. PATENT DOCUMENTS

| | | | |
|---|---|---|---|
| 2014/0351795 A1* | 11/2014 | Alfieri | G06F 30/33 |
| | | | 717/125 |
| 2016/0357890 A1* | 12/2016 | Arbel | G06F 11/3476 |
| 2017/0083480 A1* | 3/2017 | Salier-Hellendag | |
| | | | G06F 40/123 |
| 2018/0336723 A1* | 11/2018 | Elmer | G06F 16/972 |
| 2020/0019410 A1* | 1/2020 | Dima | G06F 9/448 |

OTHER PUBLICATIONS

Anderson, "Accelerate your UVM adoption and usage with an IDE," Tech Design Forum, Jan. 19, 2020, retrieved from https://www.techdesignforums.com/practice/technique/accelerate-your-uvm-adoption-and-usage-with-an-ide/, 7 pages.

Gopani, "Pass and Fail Messages with Colors . . . !," TestBench.ln, 2007, retrieved from http://www.testbench.in/colorfull_messages_from_systemverilog.html, 2 pages.

Kaushalmodi, "Specify different message formatting for 'uvm_info, 'uvm_warning, etc messages displayed on stdout and for those printed in log," Verification Academy, Jul. 11, 2014, retrieved from https://verificationacademy.com/forums/uvm/specify-different-message-formatting-uvminfo-uvmwarning-etc-messages-displayed-stdout-and-those-printed-log, 4 pages.

Latinov, "Coloured log files in Linux," Automation Rhapsody, Mar. 5, 2018, retrieved from https://automationrhapsody.com/coloured-log-files-linux/, 6 pages.

\* cited by examiner

| Report Message Macro or Severity | Simulator Behavior | Color |
|---|---|---|
| uvm_info | Display the info massages on console | Blue |
| uvm_warning | Display warning massages on console | Magenta |
| uvm_error | Increment global error count | Red |
| uvm_fatal | Exit from simulation immediately | Red |
| TEST PASSED (not a UVM report) | NA | Green |
| TEST FAILED (not a UVM report) | NA | Red |

DEVICES, SYSTEMS, AND METHODS FOR INTEGRATED CIRCUIT VERIFICATION

FIELD

The present disclosure is generally directed to devices, systems, and methods for integrated circuit (IC) verification.

BACKGROUND

Prior to manufacture, ICs typically undergo a design phase in which the IC is designed and a verification phase in which the IC design is verified. The IC may be designed using a hardware description language, such as Verilog, SystemVerilog, VHDL, and/or the like, and then the design under test (DUT) may have its operation verified by running simulations using source code developed according to Universal Verification Methodology (UVM). A computer running a simulation may include a display for showing various results of the simulation. The computer may also generate a log file for storing the results of the simulation.

BRIEF DESCRIPTION OF THE DRAWINGS

FIG. 3 illustrates a table with various report messages according to example embodiments and their respective simulator behavior with respective colors for displaying the report messages;

DETAILED DESCRIPTION

Figure 1:
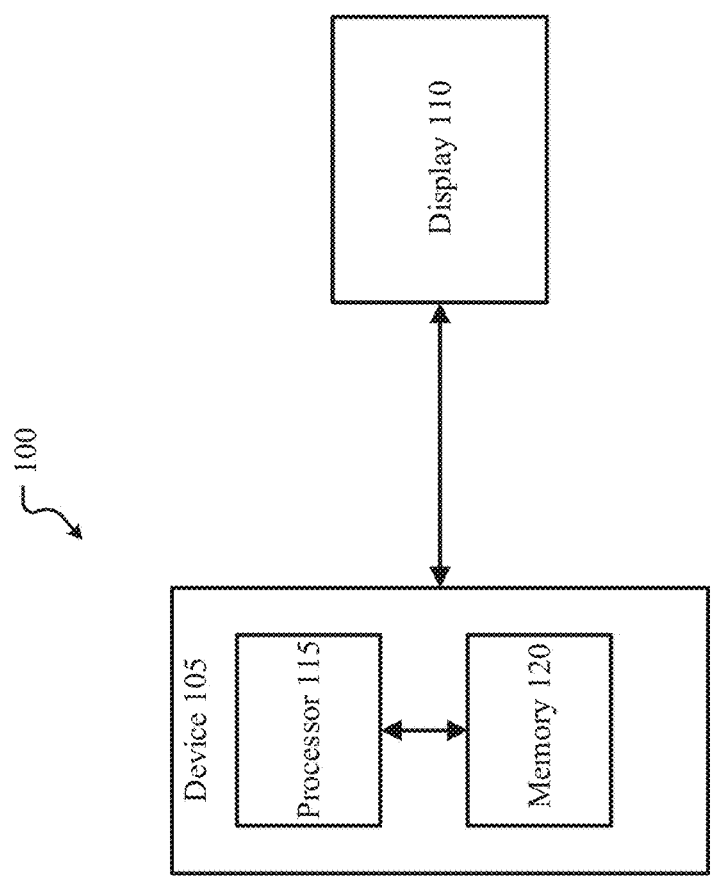
FIG. 1 illustrates a system according to at least one example embodiment.

Example embodiments relate to a new macro definition that is useful for generating colorful report messages such as info, warning, error and fatal messages (e.g., within UVM).

In more detail, at least one example embodiment defines new wrapper macros around 'uvm_info, 'uvm_warning, 'uvm_error and 'uvm_fatal macros along with the color defining macros such as 'EI_display_blue, 'EI_display_magenta, 'EI_display_red, and 'EI_display_red, respectively. At least one example embodiment uses the defined UVM macros as inputs to the color macros and thereby, generates the colorful messages. The colorful UVM report messages are for different UVM severities such as uvm_info, uvm_warning, uvm_error and uvm_fatal, which are useful during a code debugging phase.

In general, example embodiments are directed to two parts: firstly, the development of the macros for colorful display report messages; and secondly, making a text editor (e.g., gVim) compatible to reflect colorful format in the output log. As part of developing the macros, example embodiments define individual color definition macros such as 'EI_display_color_* through which string formats are passed as message arguments. As a result, the report messages can be seen in respective colors (e.g. blue, magenta, red and green). The color definition macros are bounded with UVM report messages such as 'uvm_info or 'uvm_warning or 'uvm_error or uvm_fatal macros to create new macro definitions. As a result, the report messages such as info, warning or error or fatal messages are shown in a desired color for UVM macros like uvm_color_info, uvm_color_warning or 'uvm_color_error or 'uvm_color_fatal.

As noted above, macros for different colors such as 'EI_display_color_* are defined. Secondly, the uvm_report macros (e.g., uvm_macros.svh and uvm_pkg.sv) are reused, which may be defined underneath $UVM HOME/src directory. Finally, both the color definition macros and uvm_report message macros are bounded into new macros. Without 'EI_display_color_* macros, the 'uvm_color_* macros behave like usual 'uvm_info or 'uvm_warning or 'uvm_error or uvm_fatal and are not reported in color.

In addition, the same colorful terminal report messages appear in the output log file.

The new macro definitions will result in colorful displays (colorful font) for report messages such as info, warning, error and fatal messages, which produce an improved visual representation of the log file, and hence reduce the time to analyze the simulation result. The output log file may also highlight the TEST PASSED and TEST FAILED messages.

An AnsiEsc plugin for gVim may be used to replicate color messages which contain 256 color formation functions for color presentation of respective messages. Example embodiments may be applied to, for example, gVim versions 7.0 to 7.4.

In view of the above, it should be appreciated that related art default UVM macros for report messages are colorless, whereas example embodiments generate colorful UVM report messages both in the terminal as well as in the log file.

Example embodiments will be described with reference to specific hardware and/or software components for verifying designs of ICs, however, it should be appreciated that example embodiments may be applied to other configurations of hardware and/or software for verifying designs of ICs.

FIG. 1 illustrates a system 100 according to at least one example embodiment. The system 100 may include a device 105 coupled to a display 110 via a display interface connection (e.g., DVI, HDMI, etc.). The device 105 may include a processor 115 in communication with a memory 120. The device 105 and display 110 may be a computing device such as a desktop, a laptop, a tablet, or other suitable device. As such, the display 110 may be an LED display, an LCD display, or other suitable display and the processor 115 may correspond to one or many computer processing devices. For instance, the processor 115 may be provided as a Field Programmable Gate Array (FPGA), an Application-Specific Integrated Circuit (ASIC), any other type of Integrated Circuit (IC) chip, a collection of IC chips, a microcontroller, a collection of microcontrollers, or the like. As a more specific example, the processor 115 may be provided as a microprocessor, Central Processing Unit (CPU), or plurality of microprocessors that are configured to execute the instructions sets stored in memory 120. Upon executing the instruction sets stored in memory 120, the processor 115 enables various functions of the device 105.

The memory 120 may include any type of computer memory device or collection of computer memory devices. The memory 120 may be volatile or non-volatile in nature and, in some embodiments, may include a plurality of different memory devices. Non-limiting examples of memory 120 include Random Access Memory (RAM), Read Only Memory (ROM), flash memory, Electronically-Erasable Programmable ROM (EEPROM), and Dynamic RAM (DRAM). The memory 120 may be configured to store the instruction sets depicted in addition to temporarily storing data for the processor 115 to execute various types of routines or functions. The memory 120 may include instructions that enable the processor 120 to carry out functions of the device 105. In the context of example embodiments, the memory 120 may also store applications for verifying DUTs of ICs other than the processor 115. The memory 120 may store other applications and/or programs, such as one or more terminals (e.g., GNOME), one or more electronic design automation (EDA) applications (for executing EDA languages such as Verilog, SystemVerilog, VHDL, etc.), and/or one or more text editors (e.g., Vim, gVim, etc.). In the context of example embodiments, a terminal may be an emulator which provides a text based interface (e.g., Vim) for typing commands. A terminal allows a user to access a text terminal and all its applications, for example, command line interface (CLI), text user interface (TUI), etc. Terminals may support a set of escape sequences for controlling color, cursor position, etc. Additionally or alternatively, these applications and/or other applications executable by the device 105 may be stored on a remote server in communication with the device 105 over the Internet, for example.

In general, an 'escape sequence' is a combination of characters that has a meaning other than the literal characters contained therein. An escape sequence may be marked by one or more preceding characters. The standard of escape sequence is 'ANSI escape sequence.' ANSI escape sequences' are a standard for in-band signaling for controlling color and cursor position on a terminal emulator. An 'ANSI escape sequence' may begin with 'Esc' (ASCII Code value is 27 in decimal) followed by a second byte in the range of 40 (hex)-5F (hex), which indicates ASCII characters as: @A-Z[\]^_. These characters are embedded into the text, which the terminal emulator or terminal looks for and interprets as a command, not as character code. A non-limiting example of 'ANSI escape sequence' includes the sequence 'Esc[' called 'Control Sequence Introducer' (CSI) and is a useful sequence for color display.

An 'ANSI escape sequence' for displaying color is constructed with a CSI sequence (Esc [') followed by any number of "Parameter Bytes" in the range of 30 (hex)-3F (hex), which indicate ASCII characters as: 0-9:;<=>?.

The parameter bytes are followed by any number of "Intermediate Bytes" in the range of 20 (hex)-2F (hex) which indicate ASCII characters as: Space and !"#$%&'()+,-./.

The intermediate bytes are followed by a single "Final Byte" in the range of 40 (hex)-7E (hex), which indicate ASCII characters as: @A-Z[\]^_'a-z{|}~.

In summary, the structure of an 'ANSI escape sequence' looks like: CSI<"Parameter Bytes"><"Intermediate Bytes"><"Final Byte">. For example, the 'ANSI escape sequence' for color 'Red' is: Esc[1;31m, where Esc[ is the Controlled Sequence Introducer (CSI), 1 is Set Graphics Rendition (SGR), ';' is a separator; 31 is SGR code for Red color (Foreground), and m is the final byte.

Figure 2:
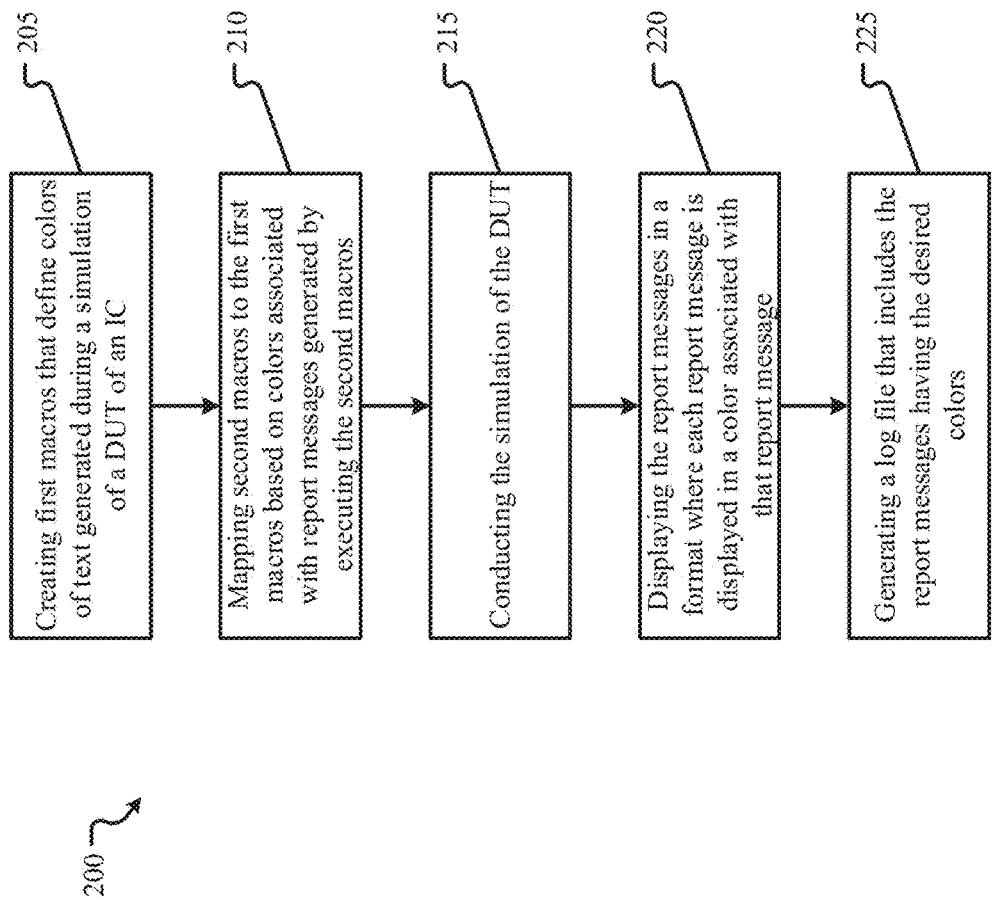
FIG. 2 illustrates a method according to at least one example embodiment.

As noted above, SGR stands for 'Select Graphics Rendition' as per (ECMA-48 Escape Sequence Standard) and/or 'Set Graphic Rendition' as per Linux Manual Pages. SGR parameters set different display attributes. Several display attributes can be set in the same sequence and be separated by semicolon. Each display attribute remains in effect until a following occurrence of SGR parameter resets the display attribute in effect. In general, there are 108 SGR codes (0-107) each of which sets a display attribute. Among these attributes, the useful codes for a standard color display are:

0→Reset/Normal (or, all attributes off);
1→Bold/Increased intensity;
30-37→Set Foreground colors;
30→Black;
31→Red;
32→Green;
33→Yellow;
34→Blue;
35→Magenta;
36→Cyan;
37→White;
40-47→Set Background colors FIG. 2 illustrates a method 200 according to at least one example embodiment. The method 200 may be carried out by the processor 115 executing instructions stored on the memory 120, for example.

In operation 205, the method 200 may include creating or storing first macros that define colors of text generated during a simulation of a design under test (DUT) of an integrated circuit (IC). The following pseudocode may correspond to modifications made inside the <File_Name>.sv file:

```
'define <Macro_Name_for_color_Red> <System Display Task("Text", signal)>; $display
'define <Macro_Name_for_color_reset> <System Display Task("Text", signal)>; $display
   module <Module Name>;
      initial
         begin
            'Macro_Name_for_color_Red ("*******This is Red*******");
            ' Macro_Name_for_color_reset( );
            #5ns;
            $finish;
         end
   endmodule
```

The <File Name>.sv file is saved and closed with the :wq command. Upon compilation and simulation, the above pseudocode generates a terminal output which may be displayed on a display unit (e.g., on the display 110) where the text "*****This is Red*****" appears in the color red.

In operation 210, the method 200 may include mapping second macros to the first macros based on colors associated with report messages generated by executing the second macros. For the mapping operation 210, the following UVM files are used:
1) UVM_INSTALLATION_PATH/uvm_macros.svh
2) UVM_INSTALLATION_PATH/uvm_pkg.sv Operation 210 may provide wrappers around existing UVM report macros like uvm_info or 'uvm_warning or 'uvm_error or 'uvm_fatal as well as the first macros for generating generic display messages in color. As noted above, example embodiments aim to print the report macros in color. Hence inside the definitions of the new macros (e.g. 'uvm_color_info, 'uvm_color_warning, 'uvm_color_error, 'uvm_color_fatal), the macro for generic display messages (e.g. 'EI_display_red, 'EI_display_blue, 'EI_display_magenta, 'EI_display_green) and original UVM report macros (e.g. 'uvm_info, 'uvm_warning, 'uvm_error, 'uvm_fatal etc.) have been defined. FIG. 3 illustrates a table 300 with various report messages according to example embodiments and their respective simulator behavior with respective colors for displaying the messages. The new macro may be defined by the below pseudocode, where in the example below the color for the message is red.

'define Novel_Macro_Name(ID,MSG)\
'Macro_Name_for_color_Red ( ); \
'Macro_of_uvm_error(ID, MSG);\
'Macro_Name_for_color_reset( );

The same or similar pseudocode can be utilized for other colors (e.g., blue, magenta, etc.).

In operation 215, the method 200 may include conducting the simulation of the DUT. For example, the processor 115 executes a script developed to simulate the UVM test bench with an EDA specific simulator command and 'tput init' to reset the terminal color. The command is used 'tput init' because 'uvm_fatal stops the execution of further lines and hence color cannot be reset to the default.

Here, it should be appreciated that the creating operation 205 and the mapping operation 210 may occur within a text editor, such as Vim, gVim, etc. It will be further appreciated that the macros need not be stored in the same file.

In operation 220, the method 200 may include displaying the report messages in a format where each report message is displayed in a color associated with that report message. As shown in FIG. 3, the report messages include different types of report messages, and each type of report message being displayed with a different color. For example, the report messages may include first messages of a first severity, second messages of a second severity, third messages of a third severity, and fourth messages of a fourth severity. The fourth severity is more severe than the third severity, the third severity is more severe than the second severity, and the second severity is more severe than the first severity. In at least one example embodiment, the report messages include UVM report messages. In this case, the first messages are information messages that may be displayed on the display 110, the second messages are warning messages that may be displayed on the display 110, the third messages are error messages that may be displayed on the display 110 and/or increment a global error count, and the fourth messages are fatal messages that may cause exit of the simulation. As further shown in FIG. 3, the report messages may also include other messages that are not UVM messages. For example, TEST PASSED and TEST FAILED messages may also be included.

In related art systems, the log file would not show the report messages in the colors displayed in operation 220 upon running the simulation in operation 215. However, in operation 225, the method 200 may include generating a log file that includes the report messages having the desired colors. As discussed in more detail below, operation 225 may include modifying at least one first file in a first directory, and modifying at least one second file in a second directory. According to at least one example embodiment, the at least one first file includes the AnsiEscPlugin.vim file beneath ~/.vim/plugin/ and the at least one second file includes the AnsiEsc.vim file beneath ~/.vim/autoload/. Upon modification of these files, a user may open a log file with Vim or gVim along with 'AnsiEsc' as a command. If the above two files do not yet exist with Vim installation, then they may be created.

Modifying the at least one first file is discussed with respect to the example below. The ~/.vim/plugin/AnsiEscPlugin.vim file has the command for public interface, e.g., com! -bang -nargs=0 AnsiEsc :call AnsiEsc#AnsiEsc (<bang>0)—command 1

The description for command 1 is as follows. Firstly, the first "AnsiEsc" mentioned in command 1 points to the gVim command given to interpret the 'ANSI escape sequence' as a command that has a meaning which is not the literal character. The "AnsiEsc" pattern provided with gvim command ('gvim -c AnsiEsc') is compared with the first AnsiEsc of public interface command as shown in command 1. AnsiEsc#AnsiEsc calls the function named as "AnsiEsc" defined in a file named as AnsiEsc.vim that exists underneath in ~/.vim/autoload/AnsiEsc.vim. A function that can be auto-loaded has a structure like the following: call <filename>#<function name>( ). When such a function is called through the command for the public interface, and it is not defined yet, the "vim or gvim" script will search underneath ~/.vim/autoload directory in 'runtimepath' for a script file called "filename.vim". In other words, we can find the declaration of AnsiEsc#AnsiEsc" function in detail in ~/.vim/autoload/AnsiEsc.vim file.

Modifying the at least one second file is discussed with respect to the example below. The ~/.vim/autoload/AnsiEsc.vim file has the declaration of "AnsiEsc#AnsiEsc" function. The AnsiEsc#AnsiEsc function describes about below functionalities: how to handle 'ANSI escape sequence'; detection of start of conceal text by some special character and end of conceal text; how to hide the conceal text; the definition for individual foreground color; and the highlight of the aforementioned colors.

Below is the AnsiEsc#AnsiEsc function description in more detail:

1) Creates a new buffer (bn) with number of buffer equal to current "number of buffer".
2) Checks if "AnsiEsc" is enabled already.
3) If AnsiEsc is enabled, then 'colorscheme' (defined in ~/.vimrc) is loaded.
4) Check for conceal status (generally the conceal feature on/off is set from ~/.vimrc).
5) If conceal is enabled, then conceal level is forced to set as 3 to hide the conceal text [e.g. (^[[0m) or (^[[0m^[[1;31m].
6) In order to handle the 'ANSI escape sequence' or to detect the 'ANSI escape sequence', string match logic is opted (characters including '\e' '\[' '\(' '\d*;' '\)*' '\d*m' '\|' '\e' '\[K' are used to detect an 'ANSI esc sequence').
   6a) Deletion of Control Sequence Introducer (CSI) (if specific characters ('CSI<Null>') or (CSI<Parameter Bytes (SGR Parameter: 0 or 1 or 2)><Final Byte>') are matched, it will be hidden (and hence will not get printed) in the log file by 'AnsiStop' command; if specific characters (CSI<Parameter Bytes (SGR Parameter: 0 or 1 or 2) ><Final Byte>; <Parameter Bytes (SGR parameters for Foreground color: e.g. 31 for Red><Final Byte>) are matched, it will be hidden (and hence will not get printed) in the log file.
7) If the vim version is higher than 7.3, then foreground colors are defined for each individual color.
8) Defines Ansi_None (for Ansi_None, color of GNOME terminal as well as GUI color is set to be none).
9) Highlights configuration declaration (how to highlight the text in specific color). Here, it should be understood that the same color among many patterns signifies that they should be of the same pattern.

Once the two files are modified as described above, the log file may be opened using "gvim -c AnsiEsc <file name>.log", and all the color attributes of the report messages appearing in operation 220 will appear in the log file.

Figure 4:
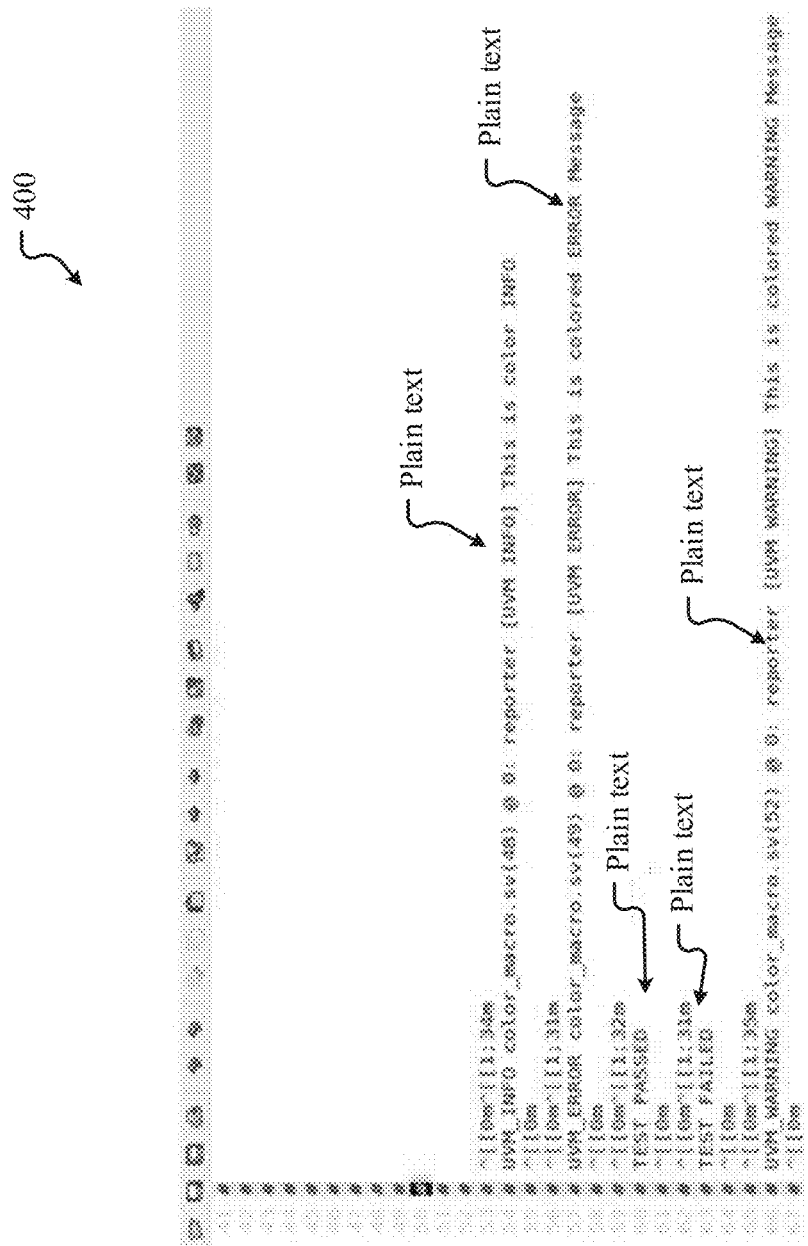
FIG. 4 illustrates an example screenshot of a log file generated without color report messages.

FIG. 4 illustrates an example screenshot 400 of a log file generated without operation 225 being carried out. In FIG. 4, the UVM info, error, and warning messages as well as the TEST PASSED and TEST FAILED messages appear in plain text (e.g., black text). FIG. 4 further shows how the color text displayed in operation 220 is substituted by prefix ANSI escape sequences with ANSI escape codes of colors.

Figure 5:
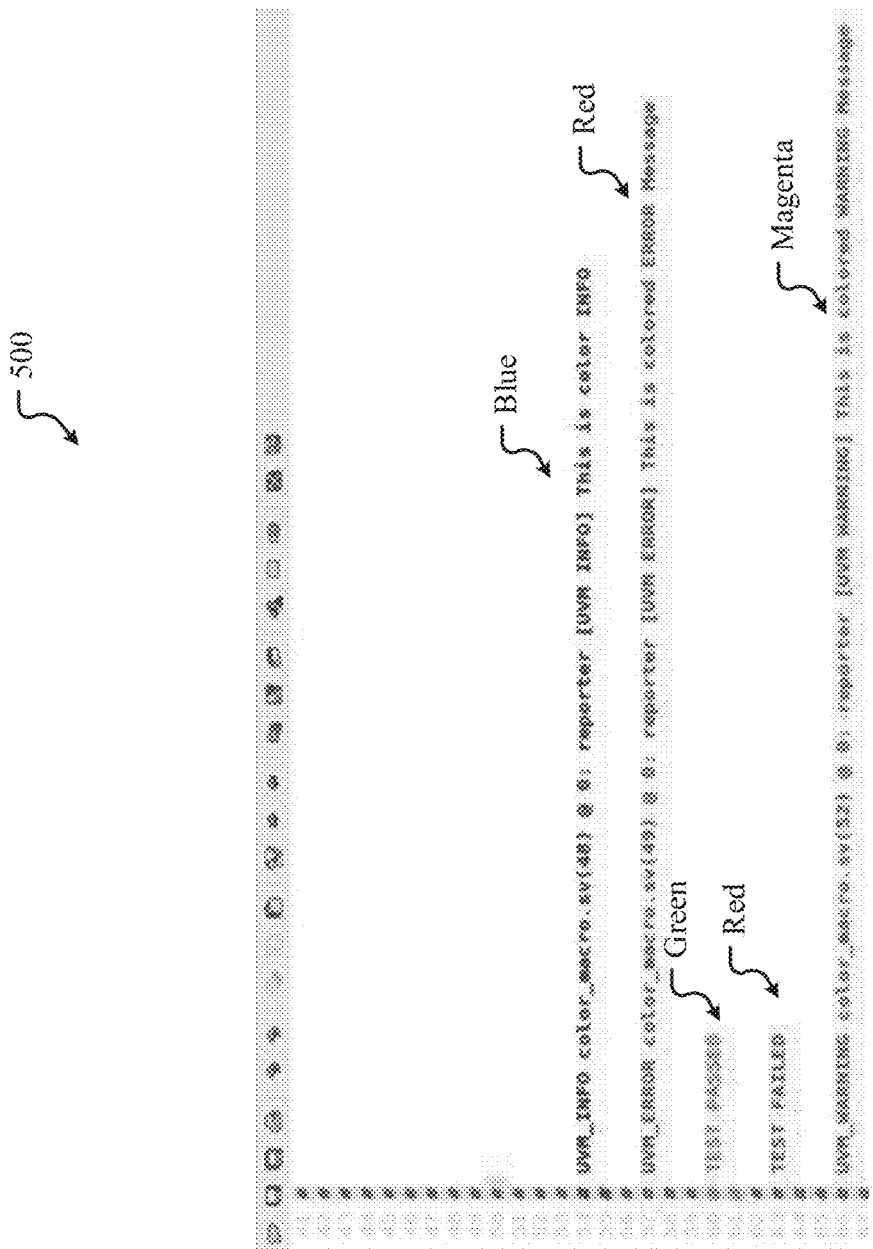
FIG. 5 illustrates an example screen shot of a log file generated with color report messages.

FIG. 5 illustrates an example screen shot 500 of a log file generated when operation 225 is carried out. As may be appreciated from a comparison of FIG. 4 and FIG. 5, FIG. 5 now shows each line with a report message in color and excludes the ANSI escape sequences and codes of colors, thereby producing an improved log file that can be easily reviewed by a user.

As EDA tools generate log or report files after simulations and in order to have control over display such as colorful messages printed on the log file, example embodiments use ANSI escape sequences along with SGR (Set Graphics Rendition) parameters which set display attributes. Several attributes can be set in the same sequence separated by semicolons. Each display attribute remains in effect until a following occurrence of SGR resets it. This approach can be used to any file with different file extensions and is not limited to a log file.

In view of the above, it should be appreciated that example embodiments provide a colorful appearance of report messages during/after simulation and in the log file so that the simulation can be easily analyzed and readable.

At least one example embodiment is directed to a method including creating or storing first macros that define colors of text generated during a simulation of a design under test (DUT) of an integrated circuit (IC). The method includes mapping second macros to the first macros based on colors associated with report messages generated by executing the second macros, conducting the simulation of the DUT, and displaying, based on the simulation, the report messages in a format where each report message is displayed in a color associated with that report message.

According to at least one example embodiment, the method may include generating a log file that includes the report messages having the desired colors.

According to at least one example embodiment, the method may include generating the log file includes modifying at least one first file in a first directory, and modifying at least one second file in a second directory.

According to at least one example embodiment, the report messages include first messages of a first severity, second messages of a second severity, third messages of a third severity, and fourth messages of a fourth severity.

According to at least one example embodiment, the fourth severity is more severe than the third severity, the third severity is more severe than the second severity, and the second severity is more severe than the first severity.

According to at least one example embodiment, the first messages are information messages, the second messages are warning messages, the third messages are error messages, and the fourth messages are fatal messages.

According to at least one example embodiment, the report messages are Universal Verification Methodology (UVM) report messages.

According to at least one example embodiment, the creating operation and the mapping operation occur within a text editor.

According to at least one example embodiment, the text editor is Vim or gVim.

According to at least one example embodiment, the report messages include different types of report messages, each type of report message being displayed with a different color.

At least one example embodiment is directed to a device including a processor; and a memory including instructions that when executed by the processor cause the processor to define, using first macros, colors for text generated during a simulation of a design under test (DUT) of an integrated circuit (IC), map second macros to the first macros based on colors associated with report messages generated by executing the second macros, conduct the simulation of the DUT, and display, based on the simulation, the report messages on a display in a format where each report message is displayed in a color associated with that report message.

According to at least one example embodiment, the memory includes instructions to generate a log file that includes the report messages having the desired colors.

According to at least one example embodiment, the instructions to generate the log file include a modification to at least one first file in a first directory, and a modification at least one second file in a second directory.

According to at least one example embodiment, the report messages include first messages of a first severity, second messages of a second severity, third messages of a third severity, and fourth messages of a fourth severity.

According to at least one example embodiment, the fourth severity is more severe than the third severity, the third severity is more severe than the second severity, and the second severity is more severe than the first severity.

According to at least one example embodiment, the first messages are information messages, the second messages are warning messages, the third messages are error messages, and the fourth messages are fatal messages.

According to at least one example embodiment, the report messages are Universal Verification Methodology (UVM) report messages.

According to at least one example embodiment, the creating operation and the mapping operation occur within a text editor.

According to at least one example embodiment, the text editor is Vim or gVim.

At least one example embodiment is directed to a system including a display, a processor, and a memory including instructions that when executed by the processor cause the processor to: define, using first macros, colors for text generated during a simulation of a design under test (DUT) of an integrated circuit (IC); map second macros to the first macros based on colors associated with report messages generated by executing the second macros; conduct the simulation of the DUT; and display, based on the simulation, the report messages on a display in a format where each report message is displayed in a color associated with that report message According to at least one example embodiment, the memory includes instructions to generate a log file that includes the report messages having the desired colors.

Any one or more of the example embodiments as substantially disclosed herein.

Any one or more of the example embodiments as substantially disclosed herein optionally in combination with any one or more other aspects/embodiments as substantially disclosed herein.

One or more means adapted to perform any one or more of the above example embodiments as substantially disclosed herein.

The phrases "at least one," "one or more," "or," and "and/or" are open-ended expressions that are both conjunctive and disjunctive in operation. For example, each of the expressions "at least one of A, B and C," "at least one of A, B, or C," "one or more of A, B, and C," "one or more of A, B, or C," "A, B, and/or C," and "A, B, or C" means A alone, B alone, C alone, A and B together, A and C together, B and C together, or A, B and C together.

The term "a" or "an" entity refers to one or more of that entity. As such, the terms "a" (or "an"), "one or more," and "at least one" can be used interchangeably herein. It is also to be noted that the terms "comprising," "including," and "having" can be used interchangeably.

The term "automatic" and variations thereof, as used herein, refers to any process or operation, which is typically continuous or semi-continuous, done without material human input when the process or operation is performed. However, a process or operation can be automatic, even though performance of the process or operation uses material or immaterial human input, if the input is received before performance of the process or operation. Human input is deemed to be material if such input influences how the process or operation will be performed. Human input that consents to the performance of the process or operation is not deemed to be "material."

Aspects of the present disclosure may take the form of an embodiment that is entirely hardware, an embodiment that is entirely software (including firmware, resident software, micro-code, etc.) or an embodiment combining software and hardware aspects that may all generally be referred to herein as a "circuit," "module," or "system." Any combination of one or more computer-readable medium(s) may be utilized. The computer-readable medium may be a computer-readable signal medium or a computer-readable storage medium.

A computer-readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer-readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer-readable storage medium may be any tangible medium that can contain or store a program for use by or in connection with an instruction execution system, apparatus, or device.

A computer-readable signal medium may include a propagated data signal with computer-readable program code embodied therein, for example, in baseband or as part of a carrier wave. Such a propagated signal may take any of a variety of forms, including, but not limited to, electromagnetic, optical, or any suitable combination thereof. A computer-readable signal medium may be any computer-readable medium that is not a computer-readable storage medium and that can communicate, propagate, or transport a program for use by or in connection with an instruction execution system, apparatus, or device. Program code embodied on a computer-readable medium may be transmitted using any appropriate medium, including, but not limited to, wireless, wireline, optical fiber cable, RF, etc., or any suitable combination of the foregoing.

The terms "determine," "calculate," "compute," and variations thereof, as used herein, are used interchangeably and include any type of methodology, process, mathematical operation or technique.

What is claimed is:

1. A method, comprising:
    storing first macros that define colors of text generated during a simulation of a design under test (DUT) of an integrated circuit (IC);
    mapping second macros to the first macros based on a plurality of colors, each of the plurality of colors being associated with one of a plurality of report messages generated by executing the second macros;
    conducting the simulation of the DUT; and
    displaying, based on the conducted simulation, the plurality of report messages in a format where each of the plurality of report messages is displayed in a color associated with the report message.

2. The method of claim 1, further comprising:
    modifying a first file and a second file; and
    generating, using the modified first and second files, a log file that includes the plurality of report messages associated with the plurality of colors.

3. The method of claim 2, wherein the first file is a .vim/plugin file and the second file is a .vim/autoload file, and wherein the plurality of report messages include first messages of a first severity, second messages of a second severity, third messages of a third severity, and fourth messages of a fourth severity.

4. The method of claim 3, wherein the fourth severity is more severe than the third severity, the third severity is more severe than the second severity, and the second severity is more severe than the first severity.

5. The method of claim 3, wherein the first messages comprise information messages, the second messages comprise warning messages, the third messages comprise error messages, and the fourth messages comprise fatal messages.

6. The method of claim 5, wherein the plurality of report messages comprise Universal Verification Methodology (UVM) report messages.

7. The method of claim 1, wherein the mapping operation occurs within a text editor.

8. The method of claim 7, wherein the text editor comprises Vim or gVim.

9. The method of claim 1, wherein the plurality of report messages comprise different types of report messages, and at least two types of report messages are each displayed with a different color.

10. A device, comprising:
    a processor; and
    a memory including instructions that when executed by the processor cause the processor to:
        define, using first macros, a plurality of colors for text generated during a simulation of a design under test (DUT) of an integrated circuit (IC);
        map second macros to the first macros based on colors associated with each of a plurality of report messages associated with the second macros;
        conduct the simulation of the DUT; and
        cause to be displayed, based on the conducted simulation, the plurality of report messages on a display in a format where each of the plurality of report messages is displayed in a color associated with the report message.

11. The device of claim 10, wherein the memory further includes instructions that cause the processor to generate a log file that includes the plurality of report messages having the associated colors.

12. The device of claim 11, wherein the instructions that cause the processor to generate the log file include a modification to at least one first file in a first directory, and a modification at least one second file in a second directory.

13. The device of claim 10, wherein the plurality of report messages include first messages of a first severity, second messages of a second severity, third messages of a third severity, and fourth messages of a fourth severity.

14. The device of claim 13, wherein the fourth severity is more severe than the third severity, the third severity is more severe than the second severity, and the second severity is more severe than the first severity.

15. The device of claim 13, wherein the first messages comprise information messages, the second messages comprise warning messages, the third messages comprise error messages, and the fourth messages comprise fatal messages.

16. The device of claim 10, wherein the plurality of report messages comprise Universal Verification Methodology (UVM) report messages.

17. The device of claim 10, wherein the defining operation and the mapping operation occur within a text editor.

18. The device of claim 17, wherein the text editor comprises Vim or gVim.

19. A system, comprising:
a display;
a processor; and
a memory including instructions that when executed by the processor cause the processor to:
- define, using first macros, a plurality of colors for text generated during a simulation of a design under test (DUT) of an integrated circuit (IC);
- map second macros to the first macros based on colors associated with each of a plurality of report messages associated with the second macros;
- conduct the simulation of the DUT; and
- cause to be displayed, based on the conducted simulation, the plurality of report messages on a display in a format where each of the plurality of report messages is displayed in a color associated with the report message.

20. The system of claim 19, wherein the memory includes instructions to cause the processor to generate, based on a first modified .vim file and a second modified .vim file, a log file that includes the plurality of report messages having the associated colors.

* * * * *